United States Patent
Fautz et al.

(10) Patent No.: US 10,928,474 B2
(45) Date of Patent: Feb. 23, 2021

(54) MAGNETIC RESONANCE APPARATUS AND METHOD FOR OBTAINING MEASUREMENT SIGNALS IN SPIN ECHO-BASED IMAGING

(71) Applicant: Siemens Healthcare GmbH, Erlangen (DE)

(72) Inventors: Hans-Peter Fautz, Forchheim (DE); Dominik Paul, Bubenreuth (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/374,961

(22) Filed: Apr. 4, 2019

(65) Prior Publication Data
US 2019/0310339 A1    Oct. 10, 2019

(30) Foreign Application Priority Data
Apr. 4, 2018  (DE) .................. 10 2018 205 075.9

(51) Int. Cl.
 G01V 3/00    (2006.01)
 G01R 33/561  (2006.01)
 G01R 33/56   (2006.01)
 G01R 33/48   (2006.01)

(52) U.S. Cl.
CPC ..... G01R 33/5617 (2013.01); G01R 33/4828 (2013.01); G01R 33/5602 (2013.01)

(58) Field of Classification Search
CPC ............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | |
|---|---|---|---|
| 6,618,608 B1 * | 9/2003 | Watkins ............. | G01R 33/4804 600/412 |
| RE45,725 E * | 10/2015 | Mugler, III ........ | G01R 33/5602 |
| 2005/0033151 A1 * | 2/2005 | Wu ...................... | G01R 33/561 600/410 |
| 2005/0119554 A1 | 6/2005 | Jenniskens et al. | |
| 2006/0140871 A1 * | 6/2006 | Sillerud .................. | B82Y 5/00 424/9.36 |
| 2014/0028313 A1 * | 1/2014 | Paul ....................... | G01R 33/56 324/309 |
| 2014/0103928 A1 * | 4/2014 | Grodzki ............. | G01R 33/4828 324/309 |
| 2015/0016701 A1 * | 1/2015 | Jog .................... | G01R 33/5608 382/131 |
| 2015/0346300 A1 * | 12/2015 | Setsompop ........ | G01R 33/4828 324/309 |
| 2017/0205483 A1 * | 7/2017 | Feiweier ............. | G01R 33/288 |

* cited by examiner

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In order to optimize magnetic resonance (MR) images in spin echo-based imaging, MR raw data are acquired by applying a static magnetic field, an excitation pulse, a refocusing pulse, and an RF pulse at the same time point as an echo elicited by the pulses with the result that the magnetization in the negative z-direction is deflected by a flip angle. The flip angle is selected such that, given a specified repetition time of the excitation pulse, a predetermined contrast is provided for two specified tissue types of the subject to be imaged. An MR image is reconstructed from the acquired MR raw data.

13 Claims, 4 Drawing Sheets

MAGNETIC RESONANCE APPARATUS AND METHOD FOR OBTAINING MEASUREMENT SIGNALS IN SPIN ECHO-BASED IMAGING

BACKGROUND OF THE INVENTION

Field of the Invention

The present invention concerns a method for obtaining magnetic resonance (MR) raw data in the form of measurement signals for reconstructing an MR image by applying a static magnetic field in the positive z-direction that produces magnetization of nuclear spins in the positive z-direction in a subject to be imaged, applying a (90°-)excitation pulse that flips the magnetization by, e.g., 90°, applying a (180°-)refocusing pulse, and applying an RF pulse at the same time point as an echo elicited by the pulses, that causes the magnetization in the negative z-direction to be deflected by a flip angle. Moreover the present invention relates to an MR apparatus that implements such a method.

Description of the Prior Art

Magnetic Resonance Imaging (MRI), also referred to as Magnetic Resonance Tomography (MRT), is a familiar imaging method in medical technology. In this regard, a subject to be investigated, for example a patient, is exposed to an at least essentially static magnetic field, onto which is imposed or overlaid a likewise essentially static, that is to say constant over time, gradient, i.e., a gradient field that increases in a spatially linear manner. Radio-frequency pulses (RF pulses), i.e., an alternating magnetic field, are then radiated that can be certain nuclear spins to be excited in a resonant manner in the investigated subject. The RF pulses are generated by using an RF amplifier and a coil supplied or driven thereby, a so-called body coil. Those parts of the investigated subject in which excitation of nuclear spin occurs are dependent on the local strength of the effective static magnetic field and the frequency of the RF pulses. Suitable variation therefore makes it possible to effect, in a targeted manner, selective excitation of a slice of the subject to be investigated. By radiating a multiplicity of RF pulses one after another, in a sequence (measurement sequence), and detecting (receiving) respective response or relaxation signals, it is thus ultimately possible to obtain a three-dimensional image of the investigated subject.

The static magnetic field causes an alignment of the dipole moments (nuclear spins) of the subject to be investigated in the field direction (z-direction). This results in the production of an externally measurable magnetization in the direction of the external static field (longitudinal magnetization). By radiating an alternating magnetic field of suitable frequency, strength, and duration (also referred to here as excitation pulse or 90°-excitation pulse) the magnetization can be flipped out of the longitudinal direction (z-direction), preferably by 90° (where relevant, also more or less), such that the spins precess in the x-y plane and the longitudinal magnetization initially has the value 0. Following the excitation pulse, the longitudinal magnetization builds up again, which is referred to as spin lattice relaxation. The time constant for this spin lattice relaxation is designated by T1.

The known spin echo technique is based on a sequence of a (90°-)excitation pulse and a (180°-)refocusing pulse. To prevent any influence of interfering magnetic fields on the precessing spins (which results in reducing synchronization between the gyrating movements of the individual spins and consequently speeds up the transverse relaxation), the (180°-)refocusing pulse is radiated at the mid-point of the time interval between the (90°-)excitation pulse and data readout (half-echo time). This pulse brings about a synchronization of the gyrating movements so that a maximally amplified signal (echo) results at the data readout time point (echo time TE).

The turbo spin echo (TSE) technique is a further development of the spin echo technique. Whereas in the spin echo sequence one echo is read out per excitation (90°-pulse), in the TSE technique multiple echoes are generated and received (echo train or pulse train respectively) per excitation by radiating additional refocusing pulses. These multiple echoes allow the measurement time to be greatly reduced, or a higher resolution to be achieved, than in the SE technique.

Spin echo-based T1-weighted imaging is a widely accepted standard for neurological, spinal, and musculoskeletal imaging. One drawback is the recording duration, which can be very long particularly in the case of magnetic flux densities of three Tesla (3 T). TSE-based recordings with short echo trains are consequently desirable in order to reduce the recording time. However, such TSE-based recordings in turn suffer from reduced contrast compared to pure SE recordings, especially at 3 T.

In gradient echo-based or pure spin echo recordings, the T1 contrast is defined by two parameters: pulse repetition time (TR) and (excitation) flip angle during excitation from the x-y plane in the negative z-direction. In T1-weighted TSE sequences on the other hand the possibility of influencing contrast is limited. The contrast is most heavily dependent on the TR alone. Due to the large refocusing flip angle the longitudinal magnetization disappears after a few pulses so that the longitudinal magnetization builds up from 0 in each case after each echo train. The magnetization available at the next excitation is therefore for the most part independent of the flip angles used. The TR and the recording time is therefore rigidly decided by the desired contrast. The option of further optimizing the contrast for a given TR or being able to set the TR flexibly without changing the contrast has not existed up to now.

A sequence known as SPACE allows recordings to be obtained by individual-slice 3D TSE sequences with slice-selective variable excitation pulses. In this regard an RF pulse with a flip angle of 90° (negative z-direction), which inverts the remaining transverse magnetization following the echo train, improves the T1 contrast for a given TR.

SUMMARY OF THE INVENTION

An object of the present invention is to optimize the contrast in MR recordings for a given TR, or to allow flexibility in the TR without changing the contrast.

The invention accordingly provides a method for obtaining a measurement signal for an MR image for spin echo-based imaging by applying a static magnetic field in the positive z-direction that produces magnetization of nuclear spins in the positive z-direction in a subject to be imaged, applying a (90°-)excitation pulse that flips the magnetization by a specified angle, applying a refocusing pulse, and applying an RF pulse at the same time point as an echo elicited by the pulses with the result that the magnetization in the negative z-direction is deflected by a flip angle, wherein the flip angle is selected such that, given a specified repetition time (TR) of the (90°-)excitation pulse, a predetermined contrast is provided for two specified tissue types of the subject.

In the present invention, a measurement signal (representing raw MR data) is accordingly obtained for reconstructing an MR image therefrom by initially applying different magnetic fields to the subject to be investigated (subject for short). The measurement signal is produced from the spin echo technique. An MR image or an MR recording is then reconstructed from the measurement signal or multiple measurement signals. First a static magnetic field $\vec{B}_0$ is applied in the positive z-direction. This results in magnetization in the positive z-direction being established in the subject.

Furthermore a (90°-)excitation pulse is applied in the MRI machine for example. This flips the magnetization, which has aligned itself in the positive z-direction up to that point, by a specifiable angle such that it has a certain component in the x-y plane. From this position the components of the magnetization vectors based on spins in the x-y plane move apart around the z-axis. Then a refocusing pulse or a gradient field is applied for refocusing or rephasing respectively, typically at the half-echo time. The previously diverging magnetization vectors move together again following the refocusing so that after the same time period as has elapsed between the (90°-)excitation pulse and the refocusing pulse, they are in phase again (rephasing). At that time point they generate a clear maximum of the induced signals, namely the spin echo.

A further RF pulse is likewise applied at that time point of the echo elicited by the pulses. The magnetization vectors are therefore situated precisely in phase and are swiveled by an angle to be determined (flip angle) in to the negative z-direction. The flip angle is selected such that, given a specified repetition time (TR) of the (90°-)excitation pulse, a given contrast is produced for two predetermined tissue types of the subject to be investigated. This means that a given contrast is set by the flip angle being correspondingly altered without the repetition time being changed. A further degree of freedom is therefore available for setting the contrast in addition to the option of making settings by using the repetition time.

In a preferred embodiment the predetermined contrast is a maximum contrast. This means that the flip angle is selected such that a maximum contrast is established depending on the repetition time.

In a further embodiment the flip angle is selected as a function of the repetition time of the (90°-)excitation pulse such that the predetermined contrast is essentially independent of the repetition time. This means that the flip angle is set as a function of the repetition time such that the contrast for the tissue pair is constant at least in a certain range of the repetition time. It is therefore possible for example to increase the repetition time while the contrast remains the same.

In a further embodiment of the inventive method, following the (90°-)excitation pulse, at least one further refocusing pulse precedes the refocusing pulse. This means that a sequence of one (90°-)excitation pulse and multiple refocusing pulses is applied, producing a pulse train. This results in the option of implementing the turbo spin echo technique, with multiple echoes being produced in a sequence of this type.

It is furthermore advantageous for the spin echo-based imaging to be T1 imaging. This means that the measurement signals are evaluated in terms of the longitudinal relaxation time T1. This time is a measure for the transverse magnetization $M_{xy}$ reverting to the longitudinal magnetization $M_z$. In human tissue, T1 relaxation times typically lie between 100 and 2000 ms.

In a specific exemplary embodiment, the two specified tissue types of the subject are white and gray brain tissue and the contrast accordingly being a gray/white contrast. This means that the flip angle is used so that a specific contrast can be set in the case of brain recordings. The gray/white contrast can be maximized in the case of brain recordings. A similar situation naturally also applies to other tissue types. Thus the contrast between cartilage tissue and muscle tissue or bone tissue and cartilage tissue can be maximized for example.

In another embodiment of the inventive method, the maximum contrast is calculated using a phase graph algorithm. This approach enables the Bloch equation to be solved favorably.

Furthermore, the static magnetic field can have a flux density (field strength) of three T or more. Improved signal quality can be achieved with such high magnetic flux densities. Superconductive coils are normally required for producing such a static magnetic field.

Preferably the repetition time (TR) is in the range from 500 to 2000 ms. First, in the case of these repetition times, a sufficiently high signal strength is attained in particular for the gray/white contrast in the case of brain recordings. Second, a fundamental influence on the contrast can also be effected by means of the flip angle with these times.

The specified angle by which the magnetization is flipped by the excitation pulse can be in a range of 90°+−45°, but in principle it can be smaller than 45°.

Furthermore, the magnetization can be flipped in each case by 180° or less with the radiation of the refocusing pulse or the at least one further refocusing pulse (α2-αn). Angles of, e.g., 120° or 150° are also practicable for energy reasons.

The aforesaid object is also achieved according to the invention by an MR apparatus for obtaining a measurement signal for an MR image for spin echo-based imaging with
- a first magnetization device that applies a static magnetic field in the positive z-direction that produces magnetization of nuclear spins in the positive z-direction in a subject to be imaged, and
- a second magnetization device that applies a (90°-)excitation pulse that flips the magnetization in the subject by a specified angle, and that also applies a refocusing pulse, and that applies an RF pulse at the same time point as an echo elicited by the pulses, with the result that magnetization in the negative z-direction is deflected by a flip angle, wherein
- the flip angle is selected with the second magnetization device such that, given a specified repetition time (TR) of the (90°-)excitation pulse, a predetermined contrast is provided for two specified tissue types of the subject.

DESCRIPTION OF THE PREFERRED EMBODIMENTS

In the example described below, brain tissue is to be investigated in an MR system. However, other tissue types can also be examined in accordance with the invention. Spin echo-based T1-weighted imaging is selected also as an example. The examples below refer to turbo spin echo techniques, but they can also be implemented analogously with simple spin echo techniques.

Figure 1:
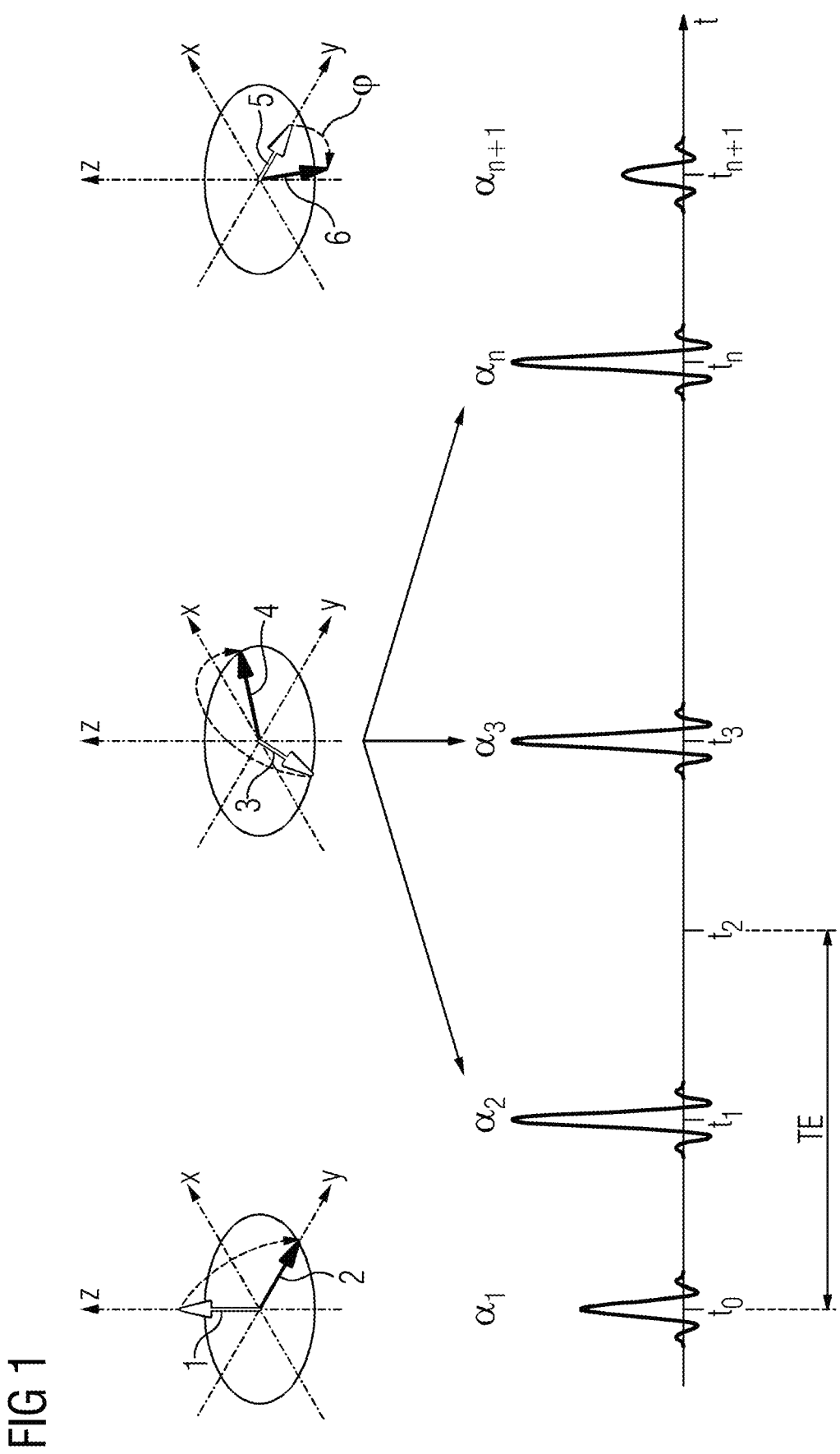
FIG. 1 shows a pulse sequence according to the present invention with an adjustable flip angle.

As shown in FIG. 1, a set of spins in an atomic nucleus, and therefore the magnetization 1 of an affected subject, is initially aligned in the z-direction. To this end a static magnetic field in the z-direction (longitudinal direction) is applied to the subject. At a time point to a (90°-)excitation pulse α1 is applied to the subject. This results in at least one component of the magnetization flipping by 90° into the x-y plane. In the process the magnetization 2, which is flipped by 90°, is produced. This flipped magnetization 2 is then situated perpendicularly to the direction of the static magnetic field. The individual magnetization vectors of the flipped magnetization 2 then diverge clockwise and counter-clockwise about the z-axis. In this regard the individual magnetization vectors have different speeds. The magnetization vectors are dephased.

Then, to achieve a rephasing or refocusing respectively, one or more refocusing pulses $\alpha_2$, $\alpha_3$-$\alpha_n$ are applied. The effect of such refocusing is represented in FIG. 1 for the refocusing pulse $\alpha_3$ with special reference to an individual magnetization vector 3. The said vector is flipped here by 180°, for example around the y-axis, resulting in the magnetization vector 4 flipped by 180° in the x-y plane being produced (the flip angle can also be smaller than 180°, e.g. 150° or 120° however). The flipped or refocused magnetization vector then returns to the starting position, in this case the y-axis corresponding to the flipped magnetization 2 following the (90°-)excitation pulse. All the other magnetization vectors in the x-y plane are likewise flipped by 180° and likewise return to the starting position at their own speeds. The (180°-)refocusing pulse therefore brings about a synchronization of the individual magnetization vectors since the same meet again in the said starting position at a time point $t_2$ and in so doing generate the so-called echo. The time point $t_2$ therefore corresponds to the echo time point. The echo time TE represents a time interval between the time point to of the (90°-)excitation pulse α1 and the echo time point $t_2$. The time point $t_1$ of the refocusing pulse $\alpha_2$ lies exactly between the two time points $t_0$ and $t_2$ since of course following the refocusing, the spins need exactly as long for the rephasing as for the dephasing.

In the present example, the further refocusing pulses $\alpha_3$ and an occur at the time points $t_3$ and $t_n$. The number of refocusing pulses can be selected according to need. There must be at least one however.

The last echo of the TSE echo train occurs at the time interval TE/2 following the time point $t_n$, that is to say at the time point $t_{n+1}$. According to the invention an RF pulse $\alpha_{n+1}$ is then applied precisely at that time point, which pulse deflects the residual transverse magnetization 5, which has decreased somewhat compared to the flipped magnetization 2 due to losses, toward the negative z-axis with the result that a flipped magnetization 6 is produced. The flip angle φ between the residual transverse magnetization 5 and the flipped magnetization 6 can be set by the RF pulse $\alpha_{n+1}$, which can also be designated as an "after-train pulse".

The contrast can be changed for a given repetition time TR as a function of the flip angle φ of the "after-train pulse" or RF pulse respectively. This can be used for example to maximize the contrast between two given tissues or tissue types respectively for a given TR. This is shown by the simulation in FIG. 2 for the gray/white contrast for gray and white brain tissue. The contrast K is plotted against a typical repetition range of 500 ms to 2000 ms. The curve 7 shows the relative difference in signal between gray and white brain matter depending on the TR used while employing a conventional TSE sequence with four refocusing pulses at 3 T. As the TR increases the contrast rises initially and then falls again. The maximum contrast is achieved at a TR of around 1100 ms using those simulation parameters.

Curve 8 shows the use of an "after-train pulse" with optimum flip angle, i.e. maximum gray/white-contrast. According to curve 8 the contrast rises steadily over the TR range from 500 to 2000 ms. At the maximum contrast $K_m$ of the conventional method without the "after-train pulse", at a TR of around 1100 ms, an increase in contrast 9 of about 10 percent can be achieved with the "after-train pulse" with an optimum flip angle of 22°. The curve 8 therefore shows the maximum possible gray/white contrast while using the optimum "after-train" flip angle.

Figure 2:
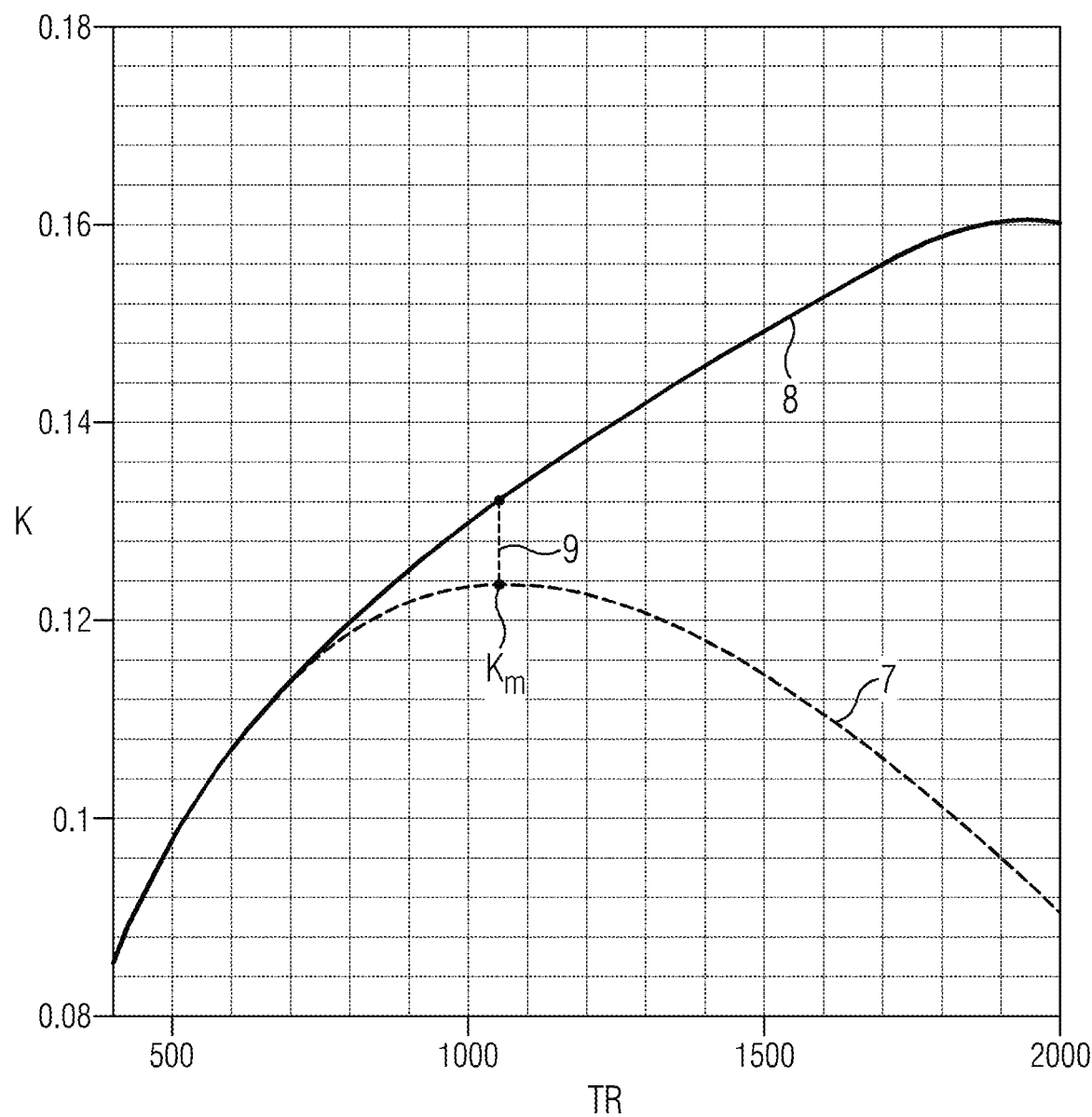
FIG. 2 is a graph of the gray/white contrast versus the repetition time TR.
Figure 3:
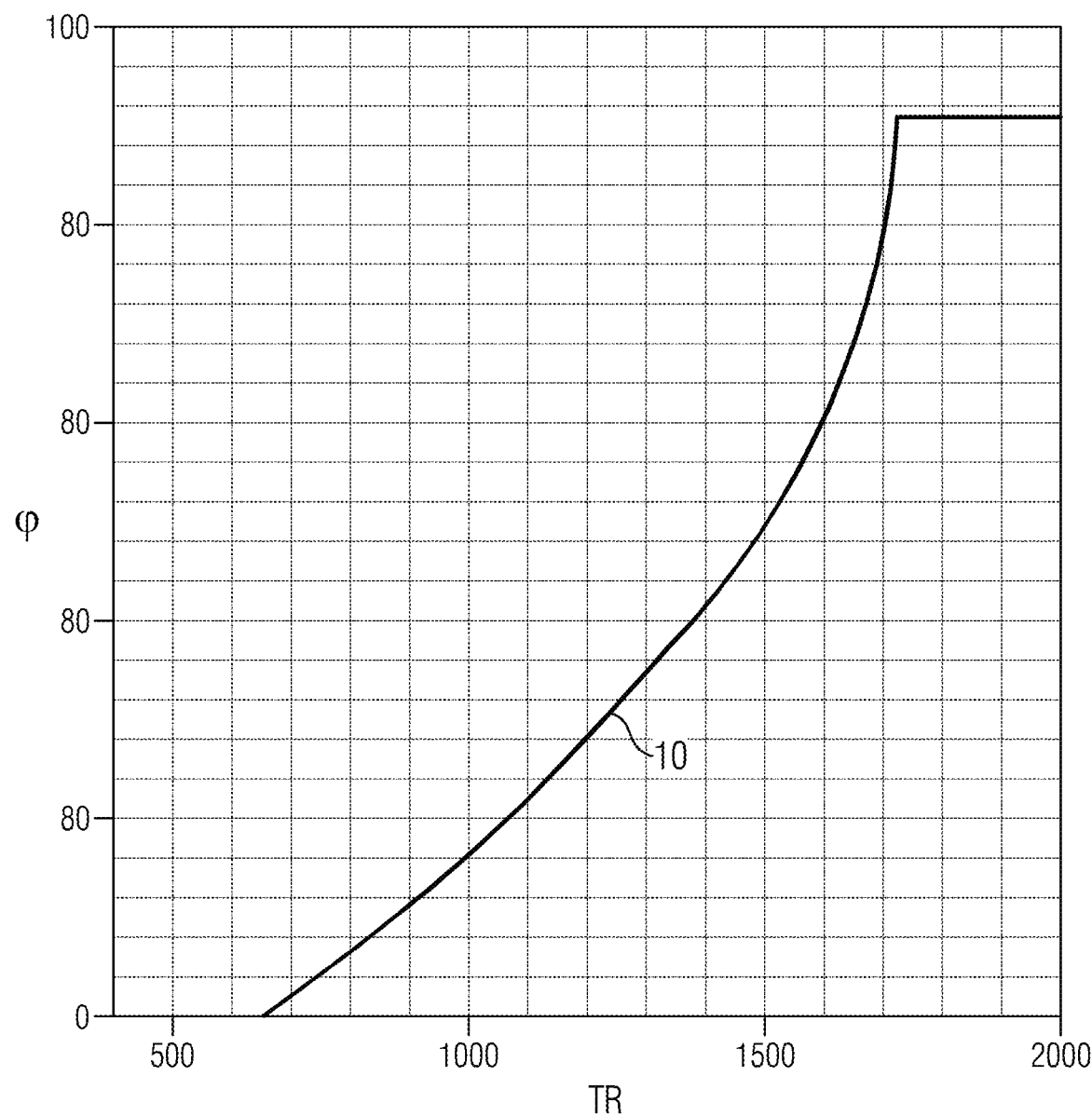
FIG. 3 is a graph of the flip angle versus the repetition time TR for maximum gray/white contrast.

The optimum flip angle φ for each TR, which results in the maximum contrast, is shown by the curve 10 in FIG. 3. It rises steadily after about 650 ms from a flip angle equal to 0° and reaches the flip angle 90°, which is optimum in this case, after about 1700 ms. Whereas the gray/white contrast conventionally decreases for increasing TR greater than 1100 ms (see FIG. 2) therefore, the gray/white contrast can be further heightened with increasing "after-train" flip angle φ.

To calculate the optimum "after-train" flip angles the signals for the TSE sequence for the tissue of interest or respectively the tissue pair of interest can be calculated for example by using known algorithms, e.g. for all whole-number flip angles from 0° to 90°. An algorithm of this type can be a so-called "phase graph" algorithm or some other algorithm for solving the Bloch equation. In particular the contrast is calculated for the various tissues from the signal amplitudes and the flip angle φ that results in the maximum contrast is identified.

In some cases it is not important to always achieve maximum contrast. Instead the aim can also be to keep a contrast constant whenever the repetition time TR changes. For example the load on the patient or the energy consumption respectively is to be lowered by extending the repetition time TR. At the same time, however, the contrast is to be maintained. In this case the aforesaid calculation of the optimum "after-train" flip angle can be used to determine, for a given TR, the flip angle which generates a contrast as similar as possible to the contrast generated with another TR (and where relevant another flip angle or flip angle 0).

Figure 4:
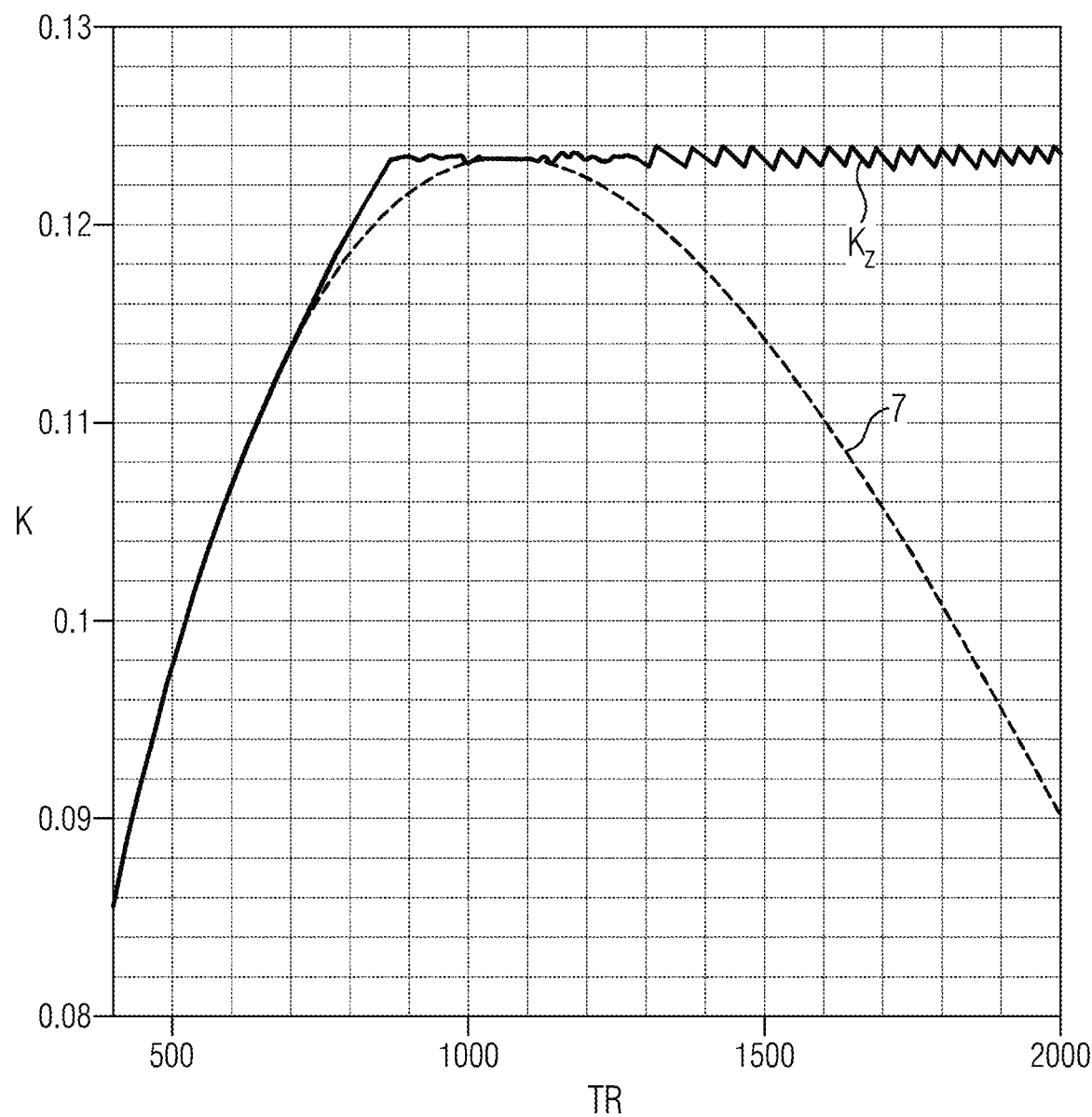
FIG. 4 is a graph of the gray/white contrast versus the repetition time TR, with the flip angle being altered such that the contrast remains constant.

In this regard FIG. 4 shows, like FIG. 2, the gray/white contrast over the repetition time TR from around 500 ms to 2000 ms. Once again the curve 7 for a conventional TSE sequence without "after-train pulses" is shown for comparison purposes. As outlined above the contrast K initially increases over the repetition time and then falls again. The curve 11 on the other hand shows the gray/white contrast for a TSE sequence with an "after-train pulse", it being possible for the contrast to be kept essentially constant over a given range of TR (here around 900 to 2000 ms) with various flip angles φ. Depending on TR therefore the flip angle φ is always selected such that a target contrast $K_z$ is achieved.

According to the invention an MR device can therefore be provided with its first magnetization device being used for applying the static magnetic field and its second magnetization device being realized for applying the SE or TSE sequence including the "after-train pulse" with the specific flip angle. This specific flip angle is set according to the above guidelines.

An advantage of the present invention therefore is modifying the T1 contrast in T1-weighted TSE recordings with any desired flip angle (even not equal to 180° with reference to the positive z-direction). For example, the optimum flip angle that maximizes a given contrast at a given TR is calculated. Special advantages in this regard are the heightened T1 contrast with a given TR and the enhancement of the maximum possible contrast with a longer TR, and therefore an expansion of the usable range of TR. Additionally advantageous is the option of keeping the contrast constant over a range of TR.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for obtaining raw data for reconstructing a magnetic resonance (MR) image therefrom, said method comprising:
   from a computer, operating an MR data acquisition scanner so as to apply a static magnetic field in a positive z-direction in the MR data acquisition scanner, which produces magnetization in the positive z-direction in an object situated in the MR data acquisition scanner;
   from said computer, operating said MR data acquisition scanner so as to execute a spin-echo-based MR data acquisition sequence, including applying an excitation pulse that tilts said magnetization by a predetermined angle;
   in said spin-echo-based sequence, applying a refocusing pulse;
   from said computer, operating said MR data acquisition scanner to additionally radiate an RF pulse at a time of an echo caused by said excitation and refocusing pulses, which deflects said magnetization in a negative z-direction by a flip angle; and
   in said computer, specifying a repetition time of said excitation pulse, and setting said flip angle, for the specified repetition time, so as to produce a predetermined contrast for two predetermined tissue types of the subject.

2. A method as claimed in claim 1 wherein said predetermined contrast is a maximum contrast.

3. A method as claimed in claim 1 comprising setting said flip angle dependent on said repetition time so that said predetermined contrast is independent of said repetition time.

4. A method as claimed in claim 1 comprising, from said computer, operating said MR data acquisition scanner to radiate at least one further refocusing pulse, preceding said refocusing pulse.

5. A method as claimed in claim 1 comprising, from said computer, operating said MR data acquisition scanner to execute said spin-echo-based sequence for T1 imaging.

6. A method as claimed in claim 1 wherein said two predetermined tissue types of the subject are white and gray brain tissue, and wherein said contrast is a gray/white contrast.

7. A method as claimed in claim 1 wherein said predetermined contrast is a maximum contrast calculated using a phase graph algorithm.

8. A method as claimed in claim 1 comprising applying said static magnetic field with a field strength of at least 3 T.

9. A method as claimed in claim 1 comprising setting said repetition time to be in a range between 500 and 2,000 ms.

10. A method as claimed in claim 1 comprising, from said computer, operating said MR data acquisition scanner to radiate said excitation pulse so as to tilt said magnetization by an excitation pulse flip angle in a range between 90°+/−45°.

11. A method as claimed in claim 1 comprising, from said computer, operating said MR data acquisition scanner to flip said magnetization with said refocusing pulse by 180°.

12. A method as claimed in claim 1 comprising, from said computer, operating said MR data acquisition scanner to radiate at least one further refocusing pulse that follows said excitation pulse and precedes said refocusing pulse, with each of said refocusing pulse and said at least one further refocusing pulse flipping said magnetization by 180°.

13. A magnetic resonance (MR) apparatus for obtaining MR raw data for reconstructing an MR image therefrom, said MR apparatus comprising:
   an MR data acquisition scanner;
   a computer configured to operate said MR data acquisition scanner so as to apply a static magnetic field in a positive z-direction in the MR data acquisition scanner, which produces magnetization in the positive z-direction in an object situated in the MR data acquisition scanner;
   said computer being configured to operate said MR data acquisition scanner so as to execute a spin-echo-based MR data acquisition sequence, including applying an excitation pulse that tilts said magnetization by a predetermined angle;
   said computer being configured to operate said MR data acquisition scanner in said spin-echo-based sequence so as to apply a refocusing pulse;
   said computer being configured to operate said MR data acquisition scanner so as to additionally radiate an RF pulse at a time of an echo caused by said excitation and refocusing pulses, which deflects said magnetization in a negative z-direction by a flip angle; and
   said computer being configured to specify a repetition time of said excitation pulse, and to set said flip angle, for the specified repetition time, so as to produce a predetermined contrast for two predetermined tissue types of the subject.

* * * * *